(12) United States Patent
Kasai et al.

(10) Patent No.: US 9,306,135 B2
(45) Date of Patent: Apr. 5, 2016

(54) MOLD RELEASE FILM AND METHOD OF PROCESS FOR PRODUCING A SEMICONDUCTOR DEVICE USING THE SAME

(71) Applicant: ASAHI GLASS COMPANY, LIMITED, Chiyoda-ku (JP)

(72) Inventors: Wataru Kasai, Tokyo (JP); Yoshiaki Higuchi, Tokyo (JP); Masakazu Ataku, Tokyo (JP); Daisuke Taguchi, Tokyo (JP); Satoshi Otsugu, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/445,663

(22) Filed: Jul. 29, 2014

(65) Prior Publication Data
US 2014/0335634 A1    Nov. 13, 2014

Related U.S. Application Data

(63) Continuation of application No. PCT/JP2013/051917, filed on Jan. 29, 2013.

(30) Foreign Application Priority Data

Jan. 30, 2012 (JP) .................................. 2012-016476

(51) Int. Cl.
*H01L 33/56* (2010.01)
*B29C 33/68* (2006.01)
(Continued)

(52) U.S. Cl.
CPC ................ *H01L 33/56* (2013.01); *B29C 33/56* (2013.01); *B29C 33/68* (2013.01); *B29C 37/0075* (2013.01); *B29C 43/021* (2013.01); *B29C 43/18* (2013.01); *B29C 43/50* (2013.01); (Continued)

(58) Field of Classification Search
CPC ......... H01L 33/56; H01L 33/58; H01L 24/97; H01L 21/566; B29C 33/68; B29C 43/18; B29C 43/50; B29C 37/00; B29C 45/14655; C08F 214/265; C08F 10/06
USPC .............. 438/26; 526/253, 255, 351; 525/199
See application file for complete search history.

(56) References Cited

U.S. PATENT DOCUMENTS

| | | | |
|---|---|---|---|
| 6,579,960 B2 * | 6/2003 | Kamiya | ................... B29C 33/68 526/250 |
| 2009/0226690 A1 * | 9/2009 | Taguchi | ................... D04H 1/56 428/219 |

FOREIGN PATENT DOCUMENTS

| | | |
|---|---|---|
| CN | 101068860 A | 11/2007 |
| JP | 2002-158242 | 5/2002 |

(Continued)

OTHER PUBLICATIONS

International Search Report issued Apr. 16, 2013 in PCT/JP2013/051917 filed Jan. 29, 2013.

*Primary Examiner* — Michael M Bernshteyn
(74) *Attorney, Agent, or Firm* — Oblon, McClelland, Maier & Neustadt, L.L.P.

(57) ABSTRACT

A mold release film, which is adapted to be disposed on the cavity surface of a mold to form a resin-encapsulated portion by encapsulating a semiconductor element of a semiconductor device with a curable encapsulation resin, has a tensile modulus of elasticity of from 10 to 24 MPa at 132° C. as measured in accordance with JIS K 7127, and a peak peel resistance of at most 0.8 N/25 mm.

15 Claims, 6 Drawing Sheets

(51) Int. Cl.
- B29C 43/18 (2006.01)
- C08J 5/18 (2006.01)
- C08F 10/06 (2006.01)
- H01L 21/56 (2006.01)
- B29C 43/02 (2006.01)
- B29C 33/56 (2006.01)
- H01L 23/00 (2006.01)
- B29C 37/00 (2006.01)
- B29C 43/50 (2006.01)
- C08F 214/26 (2006.01)
- H01L 33/58 (2010.01)
- B29C 45/14 (2006.01)
- B29C 43/34 (2006.01)
- B29L 11/00 (2006.01)
- B29K 83/00 (2006.01)
- B29L 31/34 (2006.01)

(52) U.S. Cl.
CPC ........... *B29C45/14655* (2013.01); *C08F 10/06* (2013.01); *C08F 214/265* (2013.01); *C08J 5/18* (2013.01); *H01L 21/566* (2013.01); *H01L 24/97* (2013.01); *H01L 33/58* (2013.01); *B29C 2043/182* (2013.01); *B29C 2043/3444* (2013.01); *B29C 2045/14663* (2013.01); *B29K 2083/00* (2013.01); *B29K 2827/12* (2013.01); *B29L 2011/0016* (2013.01); *B29L 2031/3406* (2013.01); *B29L 2031/3481* (2013.01); *C08J 2327/18* (2013.01); *H01L 2924/12041* (2013.01); *H01L 2924/181* (2013.01); *H01L 2933/005* (2013.01); *H01L 2933/0058* (2013.01)

(56) References Cited

FOREIGN PATENT DOCUMENTS

| | | |
|---|---|---|
| JP | 2009-285990 | 12/2009 |
| JP | 2012-153775 | 8/2012 |
| WO | 2010/023907 | 3/2010 |
| WO | 2010/079812 | 7/2010 |
| WO | 2011-037034 | 3/2011 |

* cited by examiner

MOLD RELEASE FILM AND METHOD OF PROCESS FOR PRODUCING A SEMICONDUCTOR DEVICE USING THE SAME

FIELD OF INVENTION

The present invention relates to a mold release film adapted to be disposed on the cavity surface of a mold to form a resin-encapsulated portion by encapsulating the semiconductor element of a semiconductor device with an encapsulation resin, and a process for producing a semiconductor device using the mold release film.

BACKGROUND OF INVENTION

Semiconductor devices (which should be construed to encompass a light emitting diodes as well) include a resin-encapsulated portion with a semiconductor element (which should be construed to encompass a light emitting element as well) encapsulated by an encapsulation resin therein for the purpose of protecting the semiconductor element. In a light emitting diode, the resin-encapsulated portion has a function of serving as a lens portion in order to align the directions of light emitted from the light-emitting element to the front direction of the light emitting diode to improve its front luminance.

The latest trend has been to widely utilize light emitting diodes for illumination purpose having a higher luminous flux than before (such as ceiling illumination at home, headlights for automobiles and outdoor lamps). In order to provide a light emitting diode with a higher luminous flux, it is inevitably necessary to integrate light emitting elements, resulting in the lens portion having an increased size and a complicated structure.

As the method for producing a light emitting diode, there have been known so-called compression molding method and transfer molding method where a substrate having a light emitting element mounted thereon, is disposed so that the light-emitting element is located at a certain position in a mold cavity, and an encapsulation resin is packed in the cavity to form a lens portion. In these methods, a mold release film is normally disposed on the cavity surface of the mold to prevent the encapsulation resin and the mold from being fixed together (see Patent Document 1).

PRIOR ART DOCUMENT

Patent Document

Patent Document 1: WO2011/037034

SUMMARY OF INVENTION

Technical Problem

In a case where a mold is made larger or a mold has a complicated structure in response to an increased size or a complicated structure of a lens portion, a mold release film applicable to the conventional methods is susceptible to non-uniformity in thickness because of failing to be uniformly stretched in its entirety when the mold release film is disposed so as to cover the cavity of the mold while being stretched over a wide area, or when the mold release film is disposed so as to follow the cavity surface having a wide area or a complicated structure. The non-uniformity in thickness of the mold release film is transferred to a surface of the lens portion, resulting in the distortion in the surface of the lens portion. In a case where a lens portion has a small size and has no complicated structure as in the conventional lens portions, the non-uniformity in thickness of a mold release film does not cause a significant problem because of being difficult to be transferred to the surface of the lens portion. In contrast, in a case where a lens portion has a large size and has a complicated structure, the non-uniformity in thickness of a mold release film is likely to be transferred to the surface of the lens portion. The distortion in the surface of the lens portion contributes to a decrease in the luminous efficiency of the light emitting diode, a variation in the light distribution of the light emitting diode, and so on.

It is an object of the present invention to provide a mold release film which is unlikely to be susceptible to non-uniformity in thickness at the time of being stretched even when a mold cavity where the mold release film is used has an increased size or a complicated structure, and a process for producing a semiconductor device, which is capable of controlling the distortion in the surface of a resin-encapsulated portion even when the resin-encapsulated portion has an increased size or a complicated structure.

Solution to Problem

The present invention provides a mold release film and a process for producing a semiconductor device as defined in the following items [1] to [14]:

[1] A mold release film adapted to be disposed on the cavity surface of a mold to form a resin-encapsulated portion by encapsulating a semiconductor element of a semiconductor device with a curable encapsulation resin,
the mold release film having:
a tensile modulus of elasticity of from 10 to 24 MPa at 132° C. as measured in accordance with JIS K 7127, and
a peak peel resistance of at most 0.8 N/25 mm.

[2] The mold release film according to item [1], which is a film made of a fluororesin.

[3] The mold release film according to item [2], wherein the fluororesin is a copolymer including units derived from tetrafluoroethylene, units derived from ethylene and units derived from a third monomer other than them.

[4] The mold release film according to item [3], wherein the third monomer is (perfluorobutyl)ethylene.

[5] The mold release film according to item [4], wherein the copolymer is a copolymer which has a molecular ratio of from 80/20 to 40/60 of repeating units derived from tetrafluoroethylene to repeating units derived from ethylene (tetrafluoroethylene/ethylene) and,
wherein the molecular ratio of repeating units derived from (perfluorobutyl)ethylene to all repeating units (100 mol %) is from 5 to 10 mol %.

[6] A process for producing a semiconductor device by encapsulating a semiconductor element with a curable encapsulation resin by means of a mold; comprising disposing a mold release film on a cavity surface of the mold in contact with the encapsulation resin, the mold release film having a tensile modulus of elasticity of from 10 to 24 MPa at 132° C. as measured in accordance with JIS K 7127, and a peak peel resistance of at most 0.8 N/25 mm, and forming a resin-encapsulated portion by curing the encapsulation resin in such a state that the encapsulation resin is brought into contact with the mold release film.

[7] The process for producing a semiconductor device according to item [6], wherein the semiconductor device is a light emitting diode, the semiconductor element is a light emitting element, and the resin-encapsulated portion is a lens portion.

[8] The process for producing a semiconductor device according to item [7], wherein the lens portion has an externally exposed portion, the externally exposed portion having an area of at least 56 mm$^2$.

[9] The process for producing a semiconductor device according to any one of items [6] to [8], wherein the encapsulation resin is a thermosetting resin, and the encapsulation resin is thermally cured in such a state that the encapsulation resin is brought into contact with the mold release film.

[10] The process for producing a semiconductor device according to any one of items [6] to [9], wherein the formation of the resin-encapsulated portion by means of a mold is carried out by a compression molding method.

[11] The process for producing a semiconductor device according to any one of items [6] to [9], wherein the formation of the resin-encapsulated portion by means of a mold is carried out by a transfer molding method.

[12] A process for producing a semiconductor device, including the following steps ($\alpha$1) to ($\alpha$5):

($\alpha$1) a step of disposing the mold release film as defined in any one of items [1] to (5) to cover a mold cavity, ($\alpha$2) a step of vacuum-suctioning the mold release film to a mold cavity surface side, ($\alpha$3) a step of packing an encapsulation resin in the cavity, ($\alpha$4) a step of obtaining a semiconductor device by disposing a semiconductor element at a certain position in the cavity, and encapsulating the semiconductor element with the encapsulation resin to form a resin-encapsulated portion, and ($\alpha$5) a step of taking out the semiconductor device from the mold.

[13] A process for producing a semiconductor device, including the following steps ($\beta$1) to ($\beta$5):

($\beta$1) a step of disposing the mold release film as defined in any one of items [1] to [5] to cover a mold cavity, ($\beta$2) a step of vacuum-suctioning the mold release film to a mold cavity surface side, ($\beta$3) a step of disposing a semiconductor element at a certain position in the cavity, ($\beta$4) a step of obtaining a semiconductor device by packing an encapsulation resin in the cavity, and encapsulating the semiconductor element with the encapsulation resin to form a resin-encapsulated portion, and ($\beta$5) a step of taking out the semiconductor device from the mold.

[14] A process for producing a semiconductor device according to item [12] or [13], wherein the semiconductor device is a light emitting diode, the semiconductor element is a light emitting element, the resin-encapsulated portion is a lens portion, and the lens portion has an externally exposed portion, the externally exposed portion having an area of at least 56 mm$^2$.

Advantageous Effects of Invention

The mold release film according to the present invention is unlikely to be susceptible to non-uniformity in thickness at the time of being stretched even when a mold cavity where the mold release film is used has an increased size or a complicated structure.

The process for producing a semiconductor device according to the present invention allows a semiconductor device to be produced such that the distortion in the surface of a resin-encapsulated portion is controlled even when the resin-encapsulated portion has an increased size or a complicated structure.

DETAILED DESCRIPTION OF INVENTION

<Mold Release Film>

The mold release film according to the present invention is a mold release film adapted to be disposed on the cavity surface of a mold to form a resin-encapsulated portion (which should be construed to encompass a lens diodes as well) by encapsulating a semiconductor element (which should be construed to encompass a light emitting element as well) of a semiconductor device (which should be construed to encompass a light emitting diode as well) with a curable encapsulation resin. For example, the mold release film according to the present invention is a film to increase the releasing property of an obtained light emitting diode from a mold, by being disposed to cover the cavity surface of the mold having a cavity in a shape corresponding to the shape of a lens portion of the light emitting diode during the production of the lens portion and being positioned between the formed lens portion and the cavity surface.

(Tensile Modulus of Elasticity)

The mold release film according to the present invention has a tensile modulus of elasticity of preferably from 10 to 24 MPa, more preferably 12 to 20 MPa at 132° C. as measured in accordance with JIS K 7127.

When the mold release film has a tensile modulus of elasticity within the above-mentioned ranges at 132° C., the mold release film exhibits an excellent physical property within the temperature ranges of a mold because the mold temperature is normally from 100 to 140° C. when a curable encapsulation resin is cured. In other words, when the mold release film has a tensile modulus of elasticity of at most 24 MPa at 132° C., the mold release film is unlikely to be susceptible to non-uniformity in thickness because of being uniformly stretched. Thus, it is possible to control the defect in appearance (distortion) of the surface of the resin-encapsulated portion, which is possibly caused by the transfer of the non-uniformity in thickness of the mold release film to the surface of the resin-encapsulated portion. When the mold release film has a tensile modulus of elasticity of at least 10 MPa at 132° C., the mold release film is hardly to be susceptible to the formation of a wrinkle because of being not too soft such that the mold release film is subjected to uniform tensions when the mold release film is disposed to cover a mold cavity while being stretched. Thus, it is possible to control the defect in appearance of the surface of the resin-encapsulated portion, which is possibly caused by the transfer of a wrinkle of the mold release film to the surface of the resin-encapsulated portion.

The tensile modulus of elasticity of a mold release film at 132° C. is specifically measured by carrying out a tensile test with respect to test sheets prepared by punching the mold release film in rectangular strips (Specimen Type 5) under conditions of a temperature of 132° C. and a tensile speed of 1 mm/min.

The tensile modulus of elasticity of the mold release film according to the present invention can be adjusted by controlling the crystallinity of a resin for the mold release film. Specifically speaking, as the crystallinity of a resin for the mold release film decreases, the tensile modulus of elasticity of the mold release film decreases. For example, in the case of a copolymer of ethylene/tetrafluoroethylene (hereinbelow, referred to as ETFE), the crystallinity of a resin for the mold release film may be adjusted by controlling the kind and the ratio of units derived from a third monomer other than tetrafluoroethylene (hereinbelow, referred to as TFE) and ethylene (hereinbelow, referred to as E).

(Peel Resistance)

The release film according to the present invention has a peak peel resistance of at most 0.8 N/25 mm, preferably at most 0.5N/25 mm. When the mold release film has a peak peel resistance of at most 0.8 N/25 mm, it is further easier to release the film from an encapsulation resin cured in the form of a lens when the encapsulation resin is actually produced. Thus, the mold release film is excellent in terms of continuous production because it is unlikely that the mold release film fails to be properly released from the cured encapsulation resin with the result that a production system is halted.

The peel force applied to the mold release film according to the present invention is one that is measured with the 180 degree peel-off text with respect to a combination of the mold release film and a cured encapsulation resin in accordance with JIS K 6854-2 as described below. Explanation will be made about a case where the cured encapsulation resin is a thermosetting silicone resin.

(a) A thermosetting silicone resin is applied in a proper amount between a mold release film and an aluminum sheet.

(b) The thermosetting silicone resin is cured while the mold release film and the aluminum sheet are pressed under a pressing force of 1 MPa at 130° C. for five minutes with the thermosetting silicone resin being interposed therebetween. It should be noted that the applying amount of the thermosetting silicone resin is controlled such that the cured silicone resin layer has a thickness of 100 μm.

(c) The laminated sheet of the mold release film, the cured silicon resin layer and the aluminum sheet is cut in specimens having a width of 25 mm.

(d) The 180 degree peel resistance of the mold release film to the cured silicone layer in each specimen is measured at ordinary temperatures at a release speed of 100 mm/min by means of a tension testing machine.

(e) The peak peel resistance (where the unit is N/25 mm) is found based on the peel forces in a moving distance of 25 mm to 125 mm in a curve of Force (N) to Moving Distance with a specimen is gripped.

(f) The arithmetic average of the peak peel resistances of respective mold release films is found by using five specimens.

(Thickness)

The mold release film according to the present invention has a thickness of preferably from 16 to 75 μm, more preferably from 25 to 50 μm. When the thickness is at least 16 μm, the mold release film can be easily handled and is hardly to be susceptible to the formation of a wrinkle when the mold release film is disposed to cover a mold cavity while being stretched. When the thickness is at most 75 μm, the mold release film can easily be deformed such that the mold release film has an improved property to follow the cavity shape of a mold with the result that the mold release film can be securely brought into close contact with the cavity surface, and a resin-encapsulated portion having quality can constantly be produced. Further, the thickness of the mold release film according to the present invention is preferably thinner within the above-mentioned range as the mold cavity is larger. Furthermore, the film thickness is preferably thinner within the above-mentioned range as the mold is more complicated having many cavities.

(Surface Smoothness)

The mold release film according to the present invention has a surface preferably formed so as to be smooth. By using a mold release film having a smooth surface, it is easy to form a resin-encapsulated portion having quality, and, for example, it is easy to produce a light emitting diode having excellent optical properties. When the mold release film has one surface subjected to matte finish, and when the mold release film is used so as to have the matte finish surface positioned on a mold cavity side, it is easy to carry out vacuum-suctioning of the mold release film to the cavity. The use of the mold release film having such a surface is, however, likely to cause irregularities on the surface of a resin-encapsulated portion. When the resin-encapsulated portion is formed as a lens portion in this case, the lens portion is likely to have a deteriorated precision.

The ten point mean roughness (Rz) of the surface of the mold release film according to the present invention is preferably from 0.01 to 0.1 μm in the case of a mirror surface. In the case of a matte finish surface, Rz is preferably from 0.15 to 3.5 μm. When Rz is at least 0.15 μm, the vacuum-suctioning of the mold release film according to the present invention to a cavity is accelerated. And, when Rz is at most 3.5 μm, it is easy to control the formation of irregularities on the lens surface of a resin-encapsulated portion. Rz is a value to be measured in accordance with JIS B 0601.

(Resin for Mold Release Film)

The mold release film according to the present invention is required to have a release property, surface smoothness, and heat resistance durable against a temperature of from 100 to 140° C. as the temperature of a mold during molding, and strength durable against the fluidity or pressure of an encapsulation resin. From the viewpoint of the release property, heat resistance, strength and elongation at a high temperature, the mold release film according to the present invention is preferably a film made of at least one resin selected from the group consisting of a polyolefin and a fluororesin, more preferably a film made of a fluororesin. The mold release film according to the present invention may be a film prepared by using a fluororesin and a non-fluorinated resin in combination or may be a film having an inorganic additive, an organic additive, etc. contained therein.

The polyolefin is preferably polymethylpentene from the viewpoint of the release property and the mold-following property. As the polyolefin, one type may be used alone or two or more types may be used in combination.

The fluororesin may, for example, be ETFE, polytetrafluoroethylene or a perfluoro(alkyl vinyl ether)/tetrafluoroethylene copolymer. Among them, ETFE is particularly preferred from such a viewpoint that the elongation is large at a high temperature. As the fluororesin, one type may be used alone, or two or more types may be used in combination. As the ETFE, one type may be used alone, or two or more types may be used in combination.

ETFE is preferably one including units derived from a third monomer from such a viewpoint that the crystallinity of a resin for the mold release film, i.e. the tensile modulus of elasticity of the mold release film can be easily controlled, and is particularly preferably a copolymer including units derived from TFE, units derived from E and units derived from (perfluorobutyl)ethylene from such a viewpoint that it is possible to control the tensile modulus of elasticity in a small amount.

The third monomer may, for example, be a monomer including a fluorine atom and a monomer including no fluorine atom.

Specific examples of the monomer including a fluorine atom may, for example, be the following monomers (a1) to (a5).

Monomer (a1): A fluoroolefin having at most 3 carbon atoms.

Monomer (a2): A perfluoroalkylethylene represented by the formula $X(CF_2)_nCY=CH_2$ (wherein each of X and Y which are independent of each other is a hydrogen atom or a fluorine atom, and n is an integer of from 2 to 8).

Monomer (a3): A fluorovinyl ether.

Monomer (a4): A fluorovinyl ether containing a functional group.

Monomer (a5): A fluorinated monomer having an alicyclic structure.

Monomer (a1) may, for example, be a fluoroethylene (such as trifluoroethylene, vinylidene fluoride, vinyl fluoride or chlorotrifluoroethylene), a fluoropropylene (such as hexafluoropropylene (hereinafter referred to as "HFP") or 2-hydropentafluoropropylene).

Monomer (a2) is preferably a monomer wherein n is from 2 to 6, more preferably a monomer wherein n is from 2 to 4. A monomer wherein X is a fluorine atom and Y is a hydrogen atom, i.e. (perfluorobutyl)ethylene is more preferable. Specific examples include, for example, the following ones.

$CF_3CF_2CH=CH_2$,
$CF_3CF_2CF_2CH_2CH=CH_2$ ((perfluorobutyl)ethylene, hereinafter referred to as "PFBE"),
$CF_3CF_2CF_2CF_2CF=CH_2$,
$CF_2HCF_2CF_2CF=CH_2$,
$CF_2HCF_2CF_2CF_2CF=CH_2$, etc.

Monomer (a3) may, for example, be any one of the monomers listed below. Among them, the monomers as a diene are cyclopolymerizable monomers.

$CF_2=CFOCF_3$,
$CF_2=CFOCF_2CF_3$,
$CF_2=CF(CF_2)_2CF_3$ (perfluoro(polyvinyl ether), hereinafter referred to as "PPVE"),
$CF_2=CFOCF_2CF(CF_3)O(CF_2)_2CF_3$,
$CF_2=CFO(CF_2)_3O(CF_2)_2CF_3$,
$CF_2=CFO(CF_2CF(CF_3)O)_2(CF_2)_2CF_3$,
$CF_2=CFOCF_2CF(CF_3)O(CF_2)_2CF_3$,
$CF_2=CFOCF_2CF=CF_2$,
$CF_2=CFO(CF_2)_2CF=CF_2$, etc.

Monomer (a4) may, for example, be any one of the monomers listed below.

$CF_2=CFO(CF_2)_3CO_2CH_3$,
$CF_2=CFOCF_2CF(CF_3)O(CF_2)_3CO_2CH_3$,
$CF_2=CFOCF_2CF(CF_3)O(CF_2)_2SO_2F$, etc.

Monomer (a5) may, for example, be perfluoro(2,2-dimethyl-1,3-dioxol), 2,2,4-trifluoro-5-trifluoromethoxy-1,3-dioxol, or perfluoro(2-methylene-4-methyl-1,3-dioxolane).

Specific examples of the monomer containing no fluorine may include the monomers listed below.

Monomer (b1): An olefin
Monomer (b2): A vinyl ester
Monomer (b3): A vinyl ether
Monomer (b4): An unsaturated acid anhydride Monomer (b1) may, for example, be propylene or isobutene.

Monomer (b2) may, for example, be vinyl acetate.

Monomer (b3) may, for example, be ethyl vinyl ether, butyl vinyl ether, cyclohexyl vinyl ether or hydroxybutyl vinyl ether.

Monomer (b4) may, for example, be maleic anhydride, itaconic anhydride, citraconic anhydride or himic anhydride (5-norbornene-2,3-dicarboxylic acid anhydride).

As the third monomer, one type may be used alone, or two or more types may be used in combination.

The third monomer is preferably monomer (a2), HFP, PPVE and vinyl acetate, more preferably HFP, PPVE, $CF_3CF_2CH=CH_2$ and PFBE, most preferably PFBE, from such a viewpoint that the crystallinity, i.e. the tensile modulus of elasticity can be easily controlled.

The molar ratio of repeating units derived from TFE to repeating units derived from E (i.e. TFE/E) is preferably from 80/20 to 40/60, more preferably from 70/30 to 45/55, particularly preferably from 65/35 to 50/50. When TFE/E is within any one of the above-mentioned ranges, ETFE is excellent in the heat resistance and mechanical properties.

The ratio of repeating units derived from the third monomer to all repeating units (100 mol %) is preferably from 0.01 to 20 mol %, more preferably from 0.10 to 15 mol %, particularly preferably from 0.20 to 10 mol %. When the ratio of the repeating units derived from the third monomer is within any one of the above-mentioned ranges, ETFE is excellent in the heat resistance and mechanical properties.

When the third monomer is PFBE, the ratio of the repeating units derived from PFBE to all repeating units (100 mol %) is preferably from 5 to 10 mol %, particularly preferably from 5 to 7 mol %. When the ratio of the repeating units derived from PFBE is within any one of the above-mentioned ranges, the tensile modulus of elasticity of the mold release film at 132° C. can be controlled within any one of the above-mentioned ranges.

Since an increase in the ratio of the repeating units derived from PFBE has led to problems, such as (i) a difficulty in handing a film due to being too soft, (ii) an ease in polluting rolls for production of a film due to an increase in the content of oligomers, and (iii) a difficulty in handing a film due to having a low heat resistance, the repeating units derived from PFBE have never been set at at least 5 mol % in conventional ETFE for a mold release film. In other words, the tensile modulus of elasticity at 132° C. has not been set at at least 24 MPa in conventional ETFE for a mold release film The melt flow rate (MFR) of ETFE is preferably from 2 to 40 g/10 min, more preferably from 5 to 30 g/10 min, particularly preferably from 10 to 20 g/10 min. When MFR of ETFE is in any one of such ranges, the formability of ETFE is improved to improve the mechanical properties of the mold release film.

MFR of ETFE is a value to be measured in accordance with ASTM D3159 at 297° C. by using a load of 5 kg.

(Process for Producing Mold Release Film)

The mold release film according the present invention may be produced by e.g. a melt process by means of an extruder provided with a T-die having a certain lip width by using a resin for a mold release film for example.

(Function and Advantages)

In accordance with the mold release film of the present invention as described above, the mold release film has a tensile modulus of elasticity of from 10 to 24 MPa at 132° C. such that it is possible to uniformly stretch the mold release film without forming a wrinkle in the film. Thus, the mold release film is hardly susceptible to non-uniformity in thickness when the mold release film is disposed so as to cover the cavity of the mold while being stretched over a wide area, or when the mold release film is disposed so as to follow the cavity surface having a wide area or a complicated structure. As a result, it is possible to control the distortion in the surface of a resin-encapsulation portion, which is exhibited by transference of non-uniformity in the thickness of the mold release film to the surface of the resin-encapsulation portion. When the resin-encapsulation portion forms the lens portion of a light emitting diode, the light emitting diode can be stably produced, having the lens portion formed in an effective fashion and having excellent optical properties.

<Semiconductor Device>

Examples of the semiconductor device produced by the process for producing a semiconductor device according to the present invention include an integrated circuit having transistors, diodes and other elements integrated therein, and a light emitting diode having a light emitting element.

(Light Emitting Diode)

Now, explanation will be made about a light emitting diode as an example of the semiconductor device. Such a light emitting diode has a substrate, a light emitting element mounted on the substrate and a lens portion having the light emitting element encapsulated therein for example. In a case where the light emitting diode is made to be a white emitting diode, in such a state that the light emitting element is sealed with a resin having a phosphor dispersed therein, the circumference thereof is encapsulated with an encapsulation resin to form the lens portion.

The area of the outwardly exposed portion of the lens portion (hereinbelow, referred to as surface area) is preferably at least 56 mm$^2$. Even when the lens portion has a surface area of at least 56 mm$^2$ that leads to make the surface of the lens portion susceptible to distortion in a case where a conventional mold release film is used, the use of the mold release film according to the present invention makes it difficult for the surface of the lens portion to be susceptible to the generation of distortion. The surface area of the lens portion is more preferably from 56 to 628 m$^2$, particularly preferably from 56 to 353 mm$^2$.

Examples of the shape of the lens portion include a substantially hemispherical type; a bullet-shape type consisting of a columnar form resin-encapsulated portion and a substantially hemispherical lens portion thereon; a flannel lens type; a semicylindrical type obtainable by dividing a columnar form along the axial direction thereof; and a substantially hemispherical lens array type having a plurality of substantially hemispherical lenses disposed one after another so as to form one unit.

Figure 1:
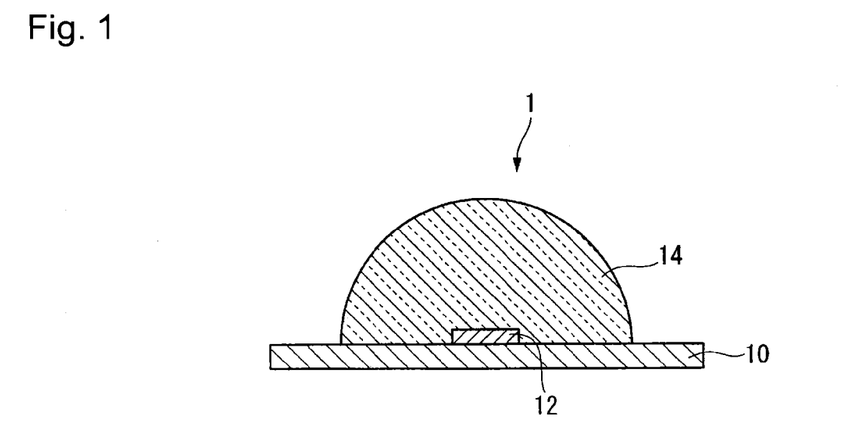
FIG. 1 is a cross-sectional view showing a typical example of the light emitting diode according to the present invention.

FIG. 1 is a cross-sectional view showing a typical example of the light emitting diode according to the present invention.

The light emitting diode 1 has a substrate 10, a light emitting element 12 mounted on the substrate 10, and a substantially hemispherical type lens portion 14 encapsulating the light emitting diode 12 therein.

Figure 2:
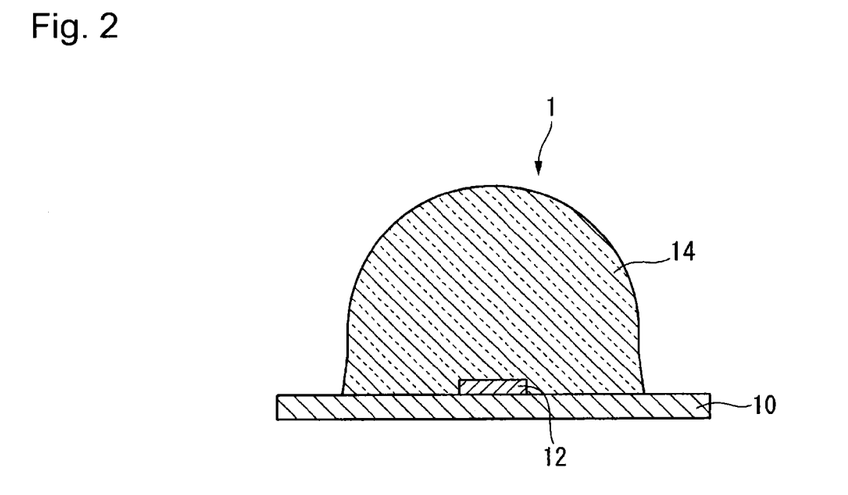
FIG. 2 is a cross-sectional view showing another typical example of the light emitting diode.

FIG. 2 is a cross-sectional view showing another typical example of the light emitting diode.

The light emitting diode 1 has a substrate 10, a light emitting element 12 mounted on the substrate 10, and a bullet-shape type lens portion 14 encapsulating the light emitting diode 12 therein.

Figure 3:
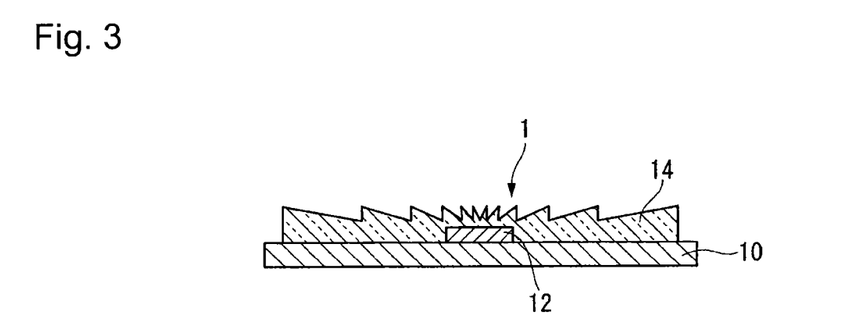
FIG. 3 is a cross-sectional view showing another typical example of the light emitting diode.

FIG. 3 is a cross-sectional view showing another typical example of the light emitting diode.

The light emitting diode 1 has a substrate 10, a light emitting element 12 mounted on the substrate 10, and a flannel lens type lens portion 14 encapsulating the light emitting diode 12 therein.

Figure 4:
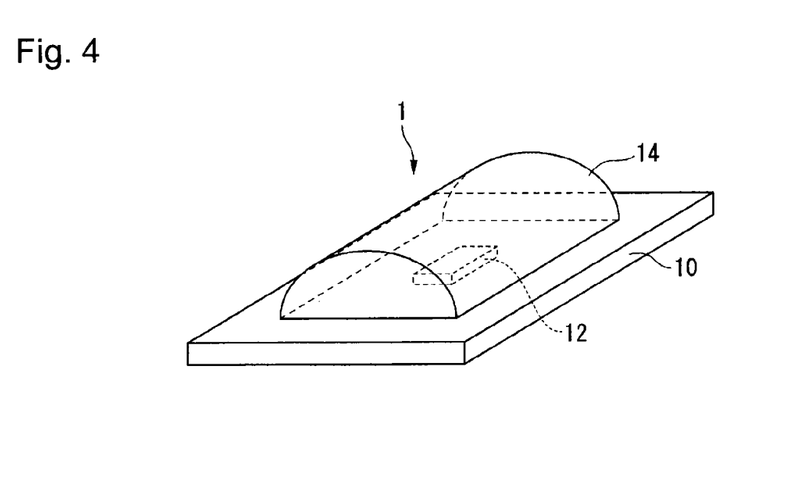
FIG. 4 is a perspective view showing another typical example of the light emitting diode.

FIG. 4 is a perspective view showing another typical example of the light emitting diode.

The light emitting diode 1 has a substrate 10, a light emitting element 12 mounted on the substrate 10, and a semicylindrical type lens portion 14 encapsulating the light emitting diode 12 therein.

Figure 5:
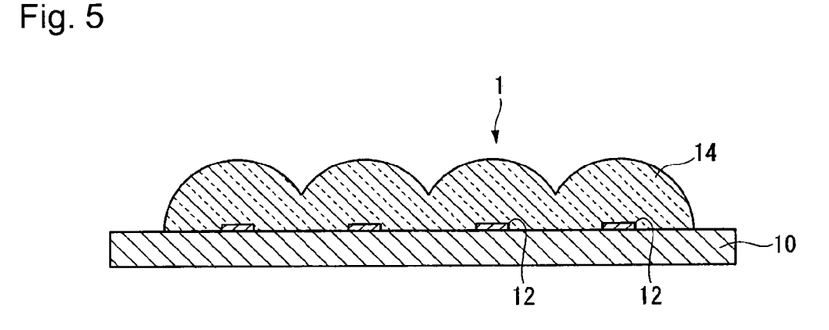
FIG. 5 is a cross-sectional view showing another typical example of the light emitting diode.

FIG. 5 is a cross-sectional view showing another typical example of the light emitting diode.

The light emitting diode 1 has a substrate 10, a plurality of light emitting elements 12 mounted on the substrate 10, and a substantially hemispherical lens array type lens portion 14 encapsulating the light emitting diodes 12 altogether therein.

<Curable Encapsulation Resin>

Examples of the curable encapsulation resin include a thermosetting resin and a photocurable resin, which are cured in a mold and becomes a cured resin therein. The curable encapsulation resin has fluidity so as to follow the inner surface shape of the mold at the time of being molded and becomes a molded product, being cured in that state. Although a resin that has fluidity at normal temperatures is normally used as the curable encapsulation resin, a resin that is solid at normal temperatures and is heated so as to be fluidized at the time of being packed in a mold may be used. Further, a resin that is packed in a mold while being in a solid state (such as a powder state), and is heated in the mold so as to be fluidized, followed by being cured may be used. The curable encapsulation resin may contain an arbitrary component, such as an additive. For example, a solid powder material, such as a filler or pigment, may be contained.

The curable encapsulation resin is preferably a thermosetting resin. The thermosetting resin is preferably such a type of thermosetting resin that forms no low molecular weight byproduct upon curing. Specific examples include a thermosetting silicone resin curable by a hydrosilylation reaction, an epoxy resin and a crosslinkable compound having at least two polymerizable unsaturated groups (such as a compound having at least two acryloyloxy groups). For example, a thermosetting resin comprising a combination of an organopolysiloxane having a vinyl group and an organopolysiloxane having a hydrogen atom bonded to a silicon atom, an epoxy resin comprising a combination of a polyepoxide base resin and a curing agent or a crosslinking agent, and a thermosetting acrylic resin comprising a combination of a compound having at least two acryloyloxy groups and a radical generator are listed. Specifically speaking, e.g. LPS-3412AJ or LPS-3412B manufactured by Shin-Etsu Chemical Co., Ltd. is listed as a commercially available thermosetting silicone resin, and e.g. SEJ-01R manufactured by Nippon Kayaku Co., Ltd. is listed as a commercially available epoxy resin.

<Process for Producing Semiconductor Device>

The process for producing a semiconductor device according to the present invention is characterized in that the mold release film according to the present invention is employed in a process for producing a semiconductor device by encapsulating a semiconductor element with a curable encapsulation resin by means of a mold. For the process for producing a semiconductor device according to the present invention, a known production process may be used except that the mold release film according to the present invention is employed. The method for producing a resin-encapsulated portion may be a compression molding method or a transfer molding method. As the production apparatus, a known compression molding apparatus or transfer molding apparatus may be used. Also with respect to the production conditions, the same conditions as the conditions in a known process for producing a semiconductor device may be used.

As the method for curing a curable encapsulation resin in the cavity of a mold to form a resin-encapsulated portion made of the cured encapsulation resin, a compression molding method or a transfer molding method is preferred. In these molding methods, the mold temperature, i.e. the temperature of the inner surface of the mold at the time of curing the encapsulation resin is normally from 100 to 140° C., although varying on the kind of the encapsulation resin. In some cases, the mold temperature is required to be higher, depending on the kind of the encapsulation resin, and the mold temperature is raised by heat generation caused when the encapsulation resin is cured. The mold release film according to the present invention can be used without problems until the mold temperature reaches about 185° C.

The mold release film according to the present invention is disposed on a cavity surface of a mold in contact with an encapsulation resin. The encapsulation resin packed in the cavity is brought into contact with the inner surface of the mold through the mold release film, and the encapsulation resin is cured and becomes a cured resin in such a state that the mold release film is brought into contact with the mold. After the encapsulation resin has been cured, a semiconductor device having a resin-encapsulated portion made of the cured encapsulation resin is taken out of the mold.

As the process for producing a semiconductor device according to the present invention, two kinds of processes of the following process ($\alpha$) and process ($\beta$) are more specifically listed according to the timing when the encapsulation resin is packed. The following process ($\alpha$) is an example of the compression molding method while the following process ($\beta$) is an example of the transfer molding method.

Process ($\alpha$): A process including the following steps ($\alpha$1) to ($\alpha$5)

($\alpha$1) a step of disposing the mold release film according to the present invention to cover a mold cavity, ($\alpha$2) a step of vacuum-suctioning the mold release film to the mold cavity surface side, ($\alpha$3) a step of packing an encapsulation resin in the cavity, ($\alpha$4) a step of disposing a semiconductor element at a certain position in the cavity and to encapsulate the semiconductor element with the encapsulation resin to obtain a semiconductor device, and ($\alpha$5) a step of taking out the semiconductor device from the mold.

Process ($\beta$): A process including the following steps ($\beta$1) to ($\beta$5)

($\beta$1) a step of disposing the mold release film according to the present invention to cover a mold cavity, ($\beta$2) a step of vacuum-suctioning the mold release film to the mold cavity surface side, ($\beta$3) a step of disposing a semiconductor element at a certain position in the cavity, ($\beta$4) a step of packing an encapsulation resin in the cavity to encapsulate the semiconductor element with the encapsulation resin to obtain a semiconductor device, and ($\beta$5) a step of taking out the semiconductor device from the mold.

(Process for Producing Light Emitting Diode)

Now, a process for producing a light emitting diode as an example of the process for producing a semiconductor device will be described.

(Process ($\alpha$))

As an example of process ($\alpha$) of the process for producing a light emitting diode, explanation will be made in detail about a case where a light emitting diode is produced by a compression molding method. The compression molding method is a process for collectively producing a plurality of light emitting diodes in large quantities as disclosed in JP-A-2005-305954.

Figure 6:
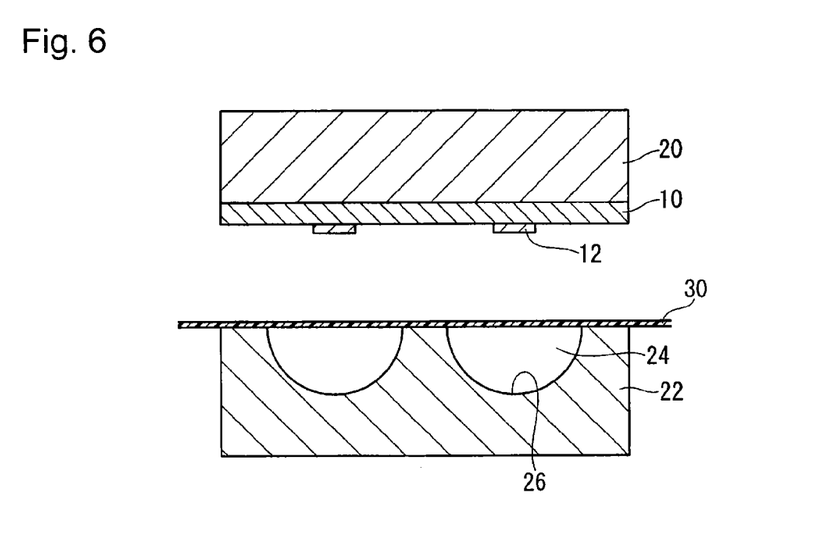
FIG. 6 is a cross-sectional view showing a step ($\alpha$1) in a process for producing a light emitting diode according to the present invention.

The mold employed in the compression molding method includes an upper die 20, an intermediate die (not shown) and a lower die 22 as shown in FIG. 6. The upper die 20 has vacuum vents (not shown) formed therein to suck a substrate 10 such that the substrate 10 with light emitting elements 12 mounted thereon can be sucked to the upper die 20. The lower die 22 has cavities 24 formed therein so as to have a shape corresponding to the shape of the lens portion 14 of the light emitting diode 1. Further, the lower die 22 has vacuum vents (not shown) formed therein to suck a mold release film 30 to the lower die 22 by evacuating the air between the mold release film 30 and the lower die 22.

The lower die 22 has cavity surfaces 26 formed so as to be preferably smooth from the viewpoint that it is easy to form a quality lens portion 14 and to obtain a light emitting diode 1 having excellent optical properties. Although the mold release film 30 can be more effectively vacuum-sucked to the cavity surfaces 26 when the cavity surfaces 26 are formed in matte finish, it is likely to cause irregularities on the surface of the lens portion 14 of an obtained light emitting diode 1 such that the lens portion has a deteriorated precision.

Step ($\alpha$1)

As shown in FIG. 6, the mold release film 30 is disposed to cover the cavities 24 of the lower die 22. The mold release film 30 is supplied from an unwinding roll (not shown) and is wound up by a winding roll (not shown). The mold release film 30 is disposed to cover the cavities 24 of the lower die 22 while being stretched because of being pulled by the unwinding roll and the winding roll.

Figure 7:
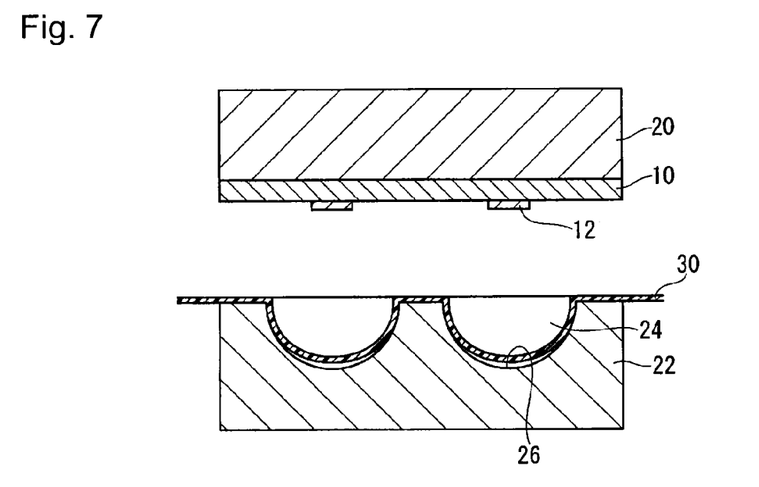
FIG. 7 is a cross-sectional view showing a step ($\alpha$2) in the process for producing a light emitting diode.

Step ($\alpha$2):

By carrying out vacuum-suction through the vacuum vents (not shown) formed in outer portions of the cavities 24 of the lower die 22, the space between the mold release film 30 and the cavity surfaces 26 is depressurized such that the mold release film is stretched and deformed so as to be vacuum-sucked to the cavity surfaces 26 of the lower die 22 as shown in FIG. 7. Further, the intermediate mold, which is disposed on the periphery of the lower die 22, is clamped to the lower die such that the mold release film 30 is placed in a tense state while being pulled from every direction.

It should be noted that the mold release film 30 is not always brought into close contact with the cavity surfaces 26, depending on the strength or thickness of the mold release film 30 under a high temperature environment or the shape of the cavities 24. As shown in FIG. 7, at the stage of vacuum-suction in step (α2), a slight gap remains between the mold release film 30 and the cavity surfaces 26 in some cases.

Figure 8:
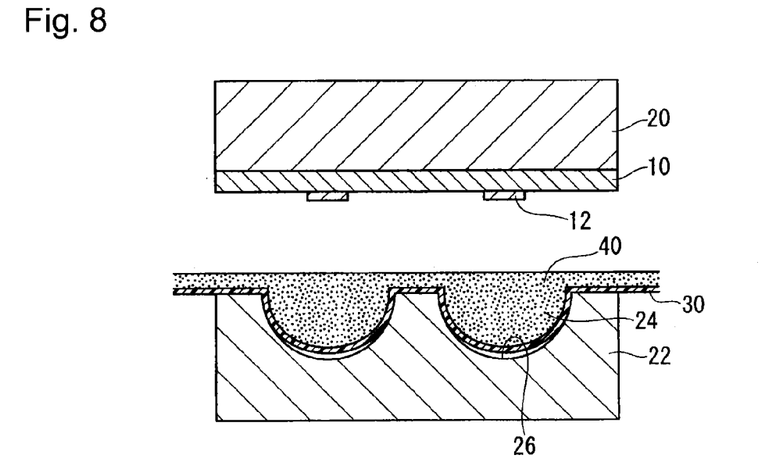
FIG. 8 is a cross-sectional view showing a step ($\alpha$3) in the process for producing a light emitting diode.

Step (α3):

As shown in FIG. 8, a curable encapsulation resin 40 is packed in an adequate amount on the mold release film 30 in the cavities 24 by an applicator (not shown).

As the encapsulation resin 40, a curable transparent resin, which can be cured as a transparent cured resin, is normally used. Otherwise, a curable resin containing e.g. an additive, which can be cured as a milky white transparent resin, may be used.

Figure 9:
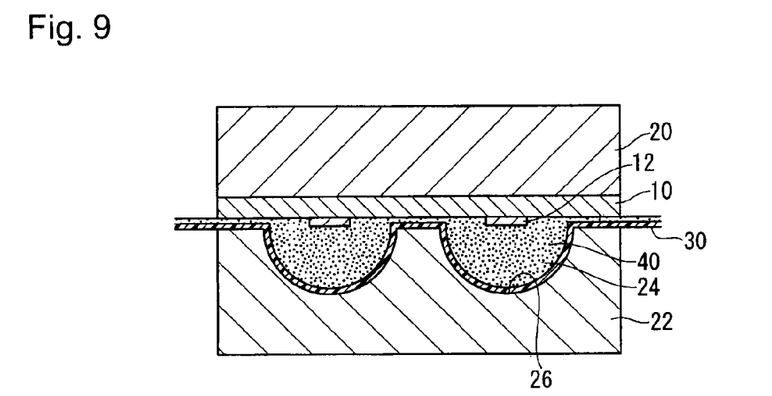
FIG. 9 is a cross-sectional view showing a step ($\alpha$4) in the process for producing a light emitting diode.

Step (α4):

As shown in FIG. 9, the lower die 22 with the encapsulation resin 40 packed on the mold release film 30 in the cavities 24 is clamped with the upper die 20 where the substrate 10 with the light emitting elements 12 mounted thereon is sucked, and the mold is heated to cure the encapsulation resin 40 as a cured resin, forming a lens portion 14 with the light emitting elements 12 encapsulated therein.

In step (α4), as the encapsulation resin 40 packed in the cavities 24 is further pushed towards the cavities 24 by the clamping pressure such that the mold release film 30 is stretched and deformed to be brought into close contact with the surfaces 26 of the cavities. Thus, the lens portion 14 is formed so as to correspond to the shape of the cavities 24.

The temperature of the mold, i.e. the temperature for curing the encapsulation resin 40 in the mold is preferably from 100 to 185° C., more preferably from 100 to 140° C. When the mold has a temperature of at least 100° C., the productivity of the light emitting diode 1 is improved. When the mold has a temperature of most 185° C., the deterioration of the encapsulation resin 40 during curing is controlled. Further, in a case where it is particularly desired to protect the light emitting diode 1 or it is necessary to more effectively control a shape change in the lens portion 14 caused by the thermal contraction due to the thermal difference between inside and outside of the mold when the cured product of the encapsulation resin 40 is taken out of the mold, the mold has a temperature of preferably at most 140° C.

The mold release film 30 has a thickness of preferably at most 75 μm when the mold is clamped. When the thickness is at most 75 μm, the mold release film can sufficiently follow the cavity surfaces 26 such that the lens portion 14 can be easily in a uniform shape.

Figure 10:
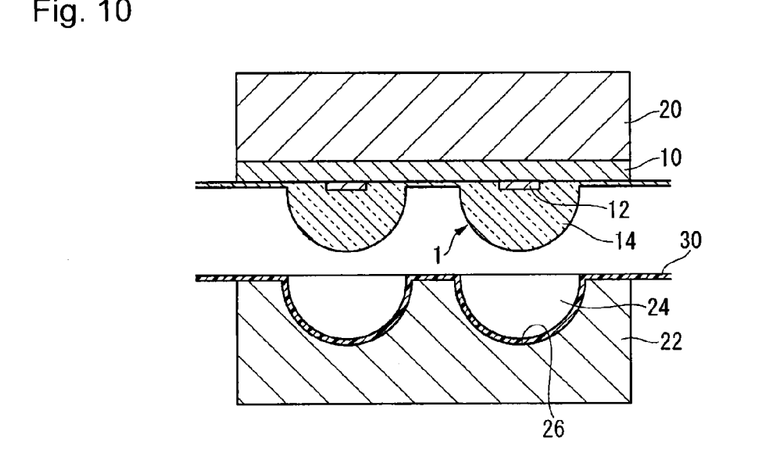
FIG. 10 is a cross-sectional view showing a step ($\alpha$5) in the process for producing a light emitting diode.

Step (α5):

As shown in FIG. 10, the upper die 20 and the lower die 22 are opened, and the light emitting diode 1 is taken out. When the mold release film has a peak peel resistance of at most 0.8 N/25 mm, it is possible to easily release the light emitting diode 1 from the mold. At the same time that the light emitting diode is released from the mold, a used part of the mold release film 30 is transferred to the winding roll (not shown), and an unused part of the mold release film 30 is fed out from the unwinding roll (not shown).

The mold release film 30 has a thickness of preferably at least 16 μm when being conveyed from the unwinding roll to the winding roll. When the thickness is less than 16 μm, the mold release film 30 is susceptible to the formation of a wrinkle. When a wrinkle is formed in the mold release film 30, the wrinkle is transferred to the lens portion 14, causing product defect. When the thickness is at least 16 μm, it is possible to control the formation of a wrinkle by applying a sufficient tension to the mold release film 30.

The release film 30 has a tensile modulus elasticity of preferably 10 MPa at 132° C. when being conveyed from the unwinding roll to the winding roll. When the tensile modulus elasticity at 132° C. is less than 10 MPa, the mold release film 30 is susceptible to the formation of wrinkle during conveyance because the mold release film 30 is too soft to be subjected to uniform tension. When a wrinkle is formed in the mold release film 30, the wrinkle is transferred to the lens portion 14, causing product defect. When the modulus of elasticity at 132° C. is at least 10 MPa, sufficient tension can be applied to the mold release film 30 to control the formation of a wrinkle.

(Process (β))

As an example of the process for producing a light emitting diode (β), explanation will be made in detail about a case where a light emitting diode is produced by a transfer molding method. The transfer molding method is a process which is normally employed for production of a light emitting diode.

Figure 11:
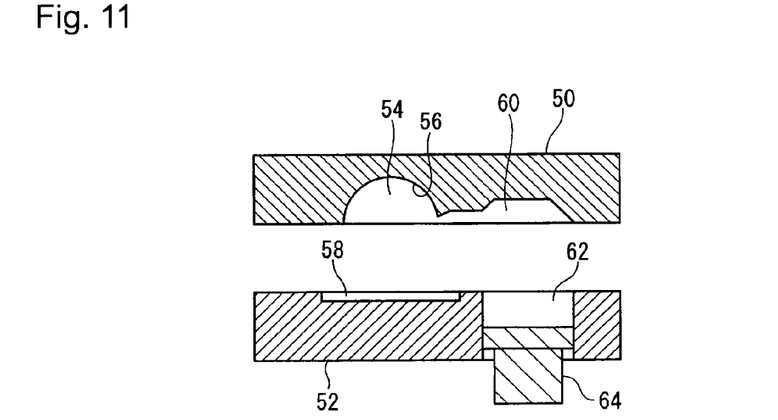
FIG. 11 is a cross-sectional view showing a typical example of the mold used in the process for producing a light emitting diode.

The mold used in the transfer molding method includes an upper die 50 and a lower die 52 as shown in FIG. 11. The upper die 50 has a cavity 54 in a shape corresponding to the lens portion 14 of a light emitting diode 1 and a concave resin-introducing portion 60 to introduce a curable encapsulation resin 40 formed therein. The lower die 52 has a substrate-placing portion 58 to place a substrate 10 with a light emitting element 12 mounted thereon and a resin-placing portion 62 to place the encapsulation resin 40 formed therein. The resin-placing portion 62 has a plunger 64 placed therein such that the plunger can push the encapsulation resin 40 out into the resin-introducing portion 60 in the upper die 50.

The upper die 50 has a cavity surface 56 formed so as to be preferably smooth from the viewpoint that it is easy to provide the lens portion 14 with quality and to provide the light emitting diode 1 with excellent optical properties. Although the mold release film 30 can be more effectively vacuum-sucked to the cavity surface 56 when the cavity surface 56 is formed in matte finish, it is likely to cause irregularities on the surface of the lens portion 14 of an obtained light emitting diode 1 such that the lens portion has a deteriorated precision.

Step (β1)

Figure 12:
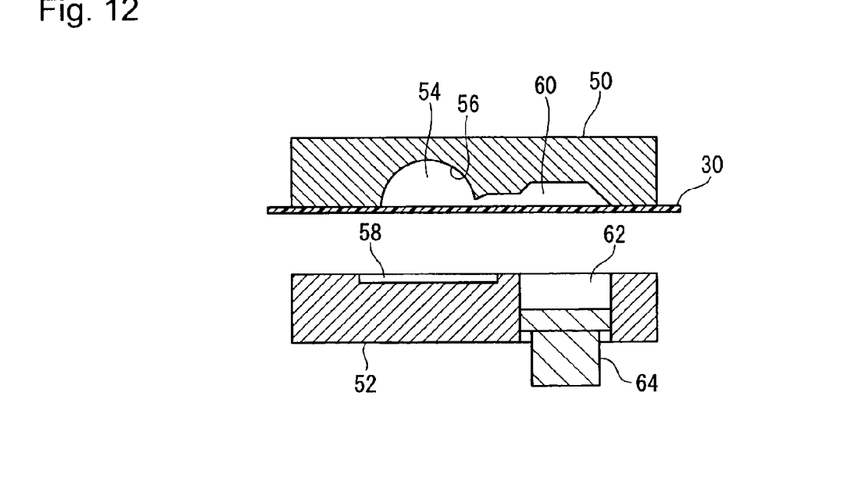
FIG. 12 is a cross-sectional view showing a step ($\alpha$1) in another process for producing a light emitting diode according to the present invention.

As shown in FIG. 12, the mold release film 30 is disposed to cover the cavity 54 of the upper die 50. The mold release film 30 is preferably disposed so as to cover the cavity 54 and the resin-introducing portion 60 in their entirety. The mold release film 30 is disposed to cover the cavity 54 of the upper die 50 while being stretched because of being pulled by an unwinding roll (not shown) and a winding roll (not shown).

Figure 13:
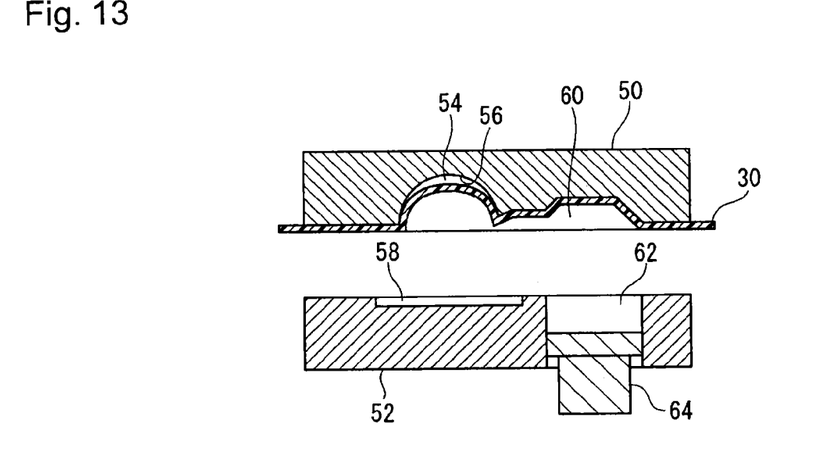
FIG. 13 is a cross-sectional view showing a step ($\alpha$2) in the process for producing a light emitting diode.

Step (β2):

By carrying out vacuum-suction through a groove (not shown) formed in an outer portion of the cavity 54 of the upper die 50, the space between the mold release film 30 and the cavity surface 56 and the space between the mold release film 30 and the inner wall of the resin-introducing portion 60 are depressurized such that the mold release film is stretched and deformed so as to be vacuum-sucked to the cavity surface 56 of the upper die 50 as shown in FIG. 13.

It should be noted that the mold release film 30 is not always brought into close contact with the cavity surface 56, depending on the strength or thickness of the mold release film 30 under a high temperature environment or the shape of the cavity 54. As shown in FIG. 13, at the stage of vacuum-suction in step (β2), a slight gap remains between the mold release film 30 and the cavity surface 56 in some cases.

Figure 14:
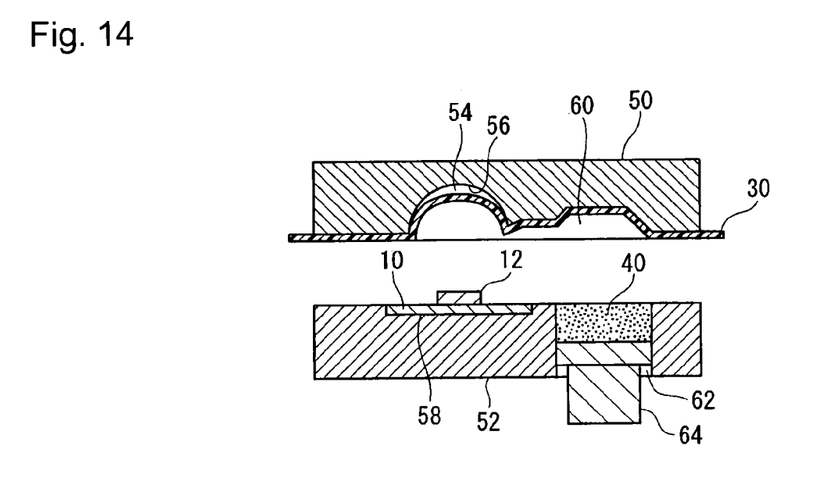
FIG. 14 is a cross-sectional view showing a step ($\alpha$3) in the process for producing a light emitting diode.

Step (β3):

As shown in FIG. 14, the substrate 10 with the light emitting element 12 mounted thereon is disposed in the substrate-placing portion 58, and the curable encapsulation resin 40 is disposed on the plunger 64 in the resin-placing portion 62. After that, the upper die 50 and the lower die 52 are clamped to dispose the light emitting element 12 at a certain position in the cavity 54.

The cured encapsulation resin 40 may be, for example, the same kind of material that is used as the encapsulation resin 40 in process (α).

Figure 15:
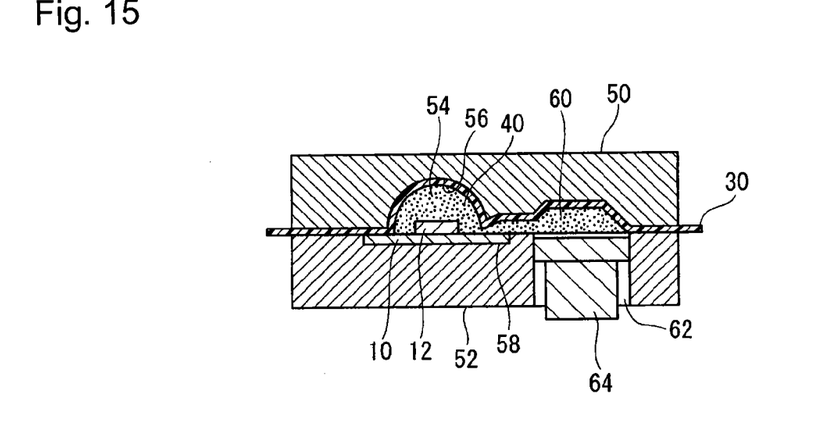
FIG. 15 is a cross-sectional view showing a step ($\alpha$4) in the process for producing a light emitting diode.

Step (β4):

As shown in FIG. 15, the plunger 64 of the lower die 52 is pushed up to pack the encapsulation resin 40 in the cavity 54 via the resin-introducing portion 60. Then, the mold is heated to cure the encapsulation resin 40 so as to form the lens portion 14 such that the light emitting element 12 is encapsulated therein.

In step (β4), by packing the encapsulation resin 40 in the cavity 54, the mold release film 30 is further pushed towards the cavity surface 56 by the resin pressure with the result that the mold release film is stretched and deformed to be brought into close contact with the cavity surface 56. Therefore, the lens portion 14 is formed in a shape corresponding to the shape of the cavity 54.

The temperature of the mold, i.e. the temperature for curing the encapsulation resin 40 is preferably set to be in any one of the same ranges as those in process (α).

The resin pressure at the time of packing the encapsulation resin 40 is preferably from 2 to 30 MPa, more preferably from 3 to 10 MPa. When the resin pressure is at least 2 MPa, it is easy to avoid a failure, such as inadequate packing of the encapsulation resin 40. When the resin pressure is at most 30 MPa, the light emitting diode 1 is easily obtainable so as to have a good quality. The resin pressure of the encapsulation resin 40 can be adjusted by the plunger 64.

Figure 16:
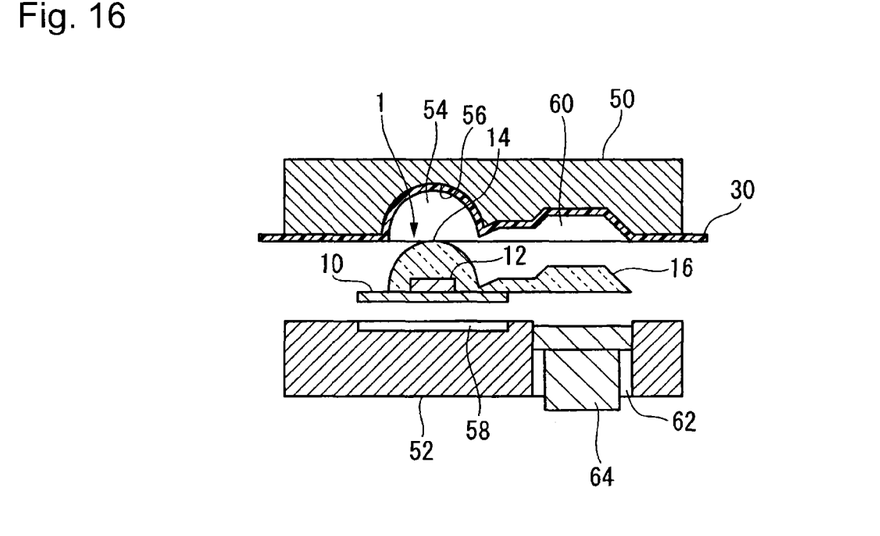
FIG. 16 is a cross-sectional view showing a step ($\alpha$5) in the process for producing a light emitting diode.

Step (β5):

As shown in FIG. 16, the light emitting diode 1 is taken out from the mold in such a state that a cured product 16 made of the encapsulation resin 40 cured in the resin-introducing portion 60 is attached to the light emitting diode, and the cured product 16 is then cut off.

In the mold after forming the lens portion 14, the mold release film 30 is disposed between the formed lens portion 14 and the cavity surface 56 with the result that the light emitting diode 1 can easily be released from the mold by applying a peel force having at least a peak value of 0.8 N/25 mm.

The process according to the present invention is also applicable to the production of a light emitting diode 1 having another shape of lens portion in the same manner as in the above-mentioned production of a light emitting diode 1 having a substantially hemispherical type lens portion 14. In such a case, the above-mentioned steps may be carried out by using a mold wherein a cavity is formed so as to correspond to the shape of a desired lens portion, and a light emitting element 12 can be set at a certain position.

(Function and Advantages)

In accordance with the process for producing a semi-conductor device according to the present invention as described above, the mold release film according to the present invention, which is hardly susceptible to non-uniformity in thickness when being stretched, can be used to control the distortion in the surface of a resin-encapsulation portion, which is exhibited by transference of non-uniformity in the thickness of the mold release film to the surface of the resin-encapsulation portion. Thus, it is possible to produce a semi-conductor device having a minimized distortion in the surface of a resin-encapsulated portion even when the resin-encapsulated portion is made larger or complicated.

EXAMPLES

Now, the present invention will be described in detail with reference to Examples, although it should be understood that the present invention is by no means restricted to these Examples.

Examples 1 to 3 are Examples while Examples 4 to 8 are Comparative Examples.

(Ratios of Respective Repeating Units)

In the examples and the comparative examples, the ratios of the respective repeating units in ETFE were calculated from the results of total fluorine measurement and molten $^{19}$F-NMR measurement.

(MFR)

In the examples and the comparative examples, MFR of ETFE was measured at 297° C. by using a load of 5 kg in accordance with ASTM D3159.

(Melting Point)

In the examples and the comparative examples, a differential scanning calorimetry (DSC 7020 manufacture by SII) was employed to find the melting points of the resins based on the endothermic peaks obtained when the resins were heated at 10° C./min.

(Tensile Modulus of Elasticity)

In each of the examples and the comparative examples, the tensile modulus of elasticity of the mold release film at 132° C. was measured in accordance with JIS K 7127. A press sheet, which was made of the same resin as the mold release film so as to have a thickness of 400 μm, was punched in rectangular strips (Specimen Type 5) to prepare test sheets. With respect to the test sheets, a tensile test was carried out under conditions of a temperature of 132° C. and a tensile speed of 1 mm/min to measure the stresses in tensile strains of 0.05% to 0.25% and to find the tensile modulus of elasticity according to the following formula:

Tensile modulus of elasticity (MPa)=(Stress (MPa) in a strain of 0.25%−Stress (MPa) in a strain of 0.05%)/(Strain of 0.25%−Strain of 0.05%)/100

(Peel Force)

In each of the examples and the comparative examples, the peel force was measured with the 180 degree peel-off text with respect to a combination of the mold release film and a two-pack mixing type thermosetting silicone resin in accordance with JIS K 6854-2 as described below.

(a) A mixed thermosetting silicone resin (OE6630 manufacture by Dow Corning Toray) was applied in an adequate amount between the mold release film and the aluminum sheet.

(b) The mold release film and the aluminum sheet with the thermosetting silicone resin interposed therebetween were pressed under a pressing force of 1 MPa at 130° C. for 5 min to cure the thermosetting silicone resin. It should be noted that the applying amount of the thermosetting silicone resin was controlled such that the cured silicone resin layer had a thickness of 100 μm.

(c) The mold release film and the aluminum sheet thus bonded were cut in specimens having a width of 25 mm.

(d) The 180 degree peel resistance of the mold release film to the cured silicone layer in each specimen was measured at ordinary temperatures at a release speed of 100 mm/min by means of a tension testing machine (RTC-1310A manufactured by ORIENTEC Co., LTD.).

(e) The peak peel resistance (where the unit is N/25 mm) was found based on the peel forces in a moving distance of 25 mm to 125 mm in a curve of Force (N) to Moving Distance with a specimen was gripped.

(f) The arithmetic average of the peak peel resistances of respective mold release films was found, using five specimens.

(Appearance of Lens Portion)

In each of the Examples and the Comparative Examples, the appearance of the lens portion was visually evaluated after production of the light emitting diode.

⊚ (which stands for excellent): The lens portion had a uniform surface and no defect.

○ (which stands for good): Although the surface of lens portion appeared to be slightly strained, there was no effect to the function of the lens portion.

× (which stands for no good): Defects, such as strain or a wrinkle, were observed on the surface of the lens portion.

Example 1

(Production of ETFE)

87.3 kg of 1-hydrotridecafluorohexane, 4.21 kg of 1,3-dichloro-1,1,2,2,3-pentafluoropropane (AK225cb manufactured by Asahi Glass Company, Limited, hereinbelow referred to as AK225cb) and 2.13 kg of PFBE were charged into an evacuated autoclave having an internal capacity of 94 litters and made of stainless steel, and were heated up to 66° C. while being stirred. A gas mixture of TFE/E=89/11 (molar ratio) was introduced into the heated mixture until the pressure reached 1.5 MPa. 60.4 kg of a 50% solution of tert-butyl peroxypivalate in AK225cb was charged to initiate polymerization. During polymerization, a gas mixture of TFE/E=60/40 (molar ratio) and 7.0 mol % of PFBE relative to the gas mixture were continuously added so as to maintain the pressure at 1.5 MPaG. After 7.19 kg of the gas mixture of TFE/E was charged, the autoclave was cooled, and the residual gas was purged to complete the polymerization. The time required to the polymerization was 333 minutes.

The resulting ETFE slurry was transferred into a granulation tank having an internal capacity of 220 liters, 77 liters of water was added to the slurry in the granulation tank, the slurry was heated while being stirred, and the polymerization solvent and the residual monomers were removed to obtain 7.2 kg of granular ETFE (1).

ETFE (1) thus obtained contained (repeating units derived from TFE)/(repeating units derived from E)/(repeating units of PFBE)=54.5/39.0/6.5 (molar ratio) and had an MFR of 16.2 g/10 min and a melting point of 195° C.

(Production of Mold Release Film)

By melt-extruding ETFE (1) at 300° C. by an extruder having a lip adjusted to provide ETFE (1) with a thickness of 50 μm, a mold release film (1) was obtained so as to have a thickness of 50 μm. The mold release film (1) had a tensile modulus of elasticity of 12 MPa at 132° C. and a peak peel resistance of 0.6 N/25 mm.

(Production of Light Emitting Diode)

As the light emitting element 12, a white emitting element (operating voltage: 3.5 V, consumption current: 10 mA) was used.

As the mold release film 30, the mold release film (1) was used.

As the encapsulation resin 40, two-pack mixing type of curable silicone resin (mixture of equivalent amounts of LPS-3412A manufactured by Shin-Etsu Chemical Co., Ltd. and LPS-3412B manufactured by Shin-Etsu Chemical Co., Ltd.) was used. This curable silicone resin becomes a transparent cured resin.

As the mold, the mold shown in FIG. 11 was used. The cavity 54 of the upper die 50 was formed in a shape corresponding to a substantially hemispherical type lens portion having a surface area of 56 mm².

The mold release film 30 was disposed to cover the cavity 54 of the upper die 50. A substrate with the white light emitting element 12 mounted thereon was disposed on the lower die 52 such that the light emitting element 12 was located at a position corresponding to the center of the opening of the cavity 54, and the curable silicone resin was disposed on the plunger 64 of the resin-placing portion 62. By vacuum-suction, the mold-release film 30 was vacuum-sucked to the cavity surface 56, and the mold was clamped, followed by packing the encapsulation resin 40 in the cavity 54. The mold was heated to cure the encapsulation resin 40 to form a substantially hemispherical type lens portion 14. The temperature for heating the mold was 110° C. Further, the curing time was set at 3 minutes. Thereafter, a light emitting diode 1 was taken out from the mold by opening the upper die 50 and the lower die 52. The appearance of the lens portion was evaluated. The evaluation results are shown in Table 1.

Example 2

(Production of Mold Release Film)

A mold release film (2) was obtained in the same manner as in Example 1 except that the lip was adjusted to provide the mold release film with a thickness of 25 μm. The mold release film (2) had a tensile modulus of elasticity of 12 MPa at 132° C. and a peak peel resistance of 0.6 N/25 mm.

The mold release film (2) was used to produce a light emitting diode in the same manner as in Example 1. The appearance of the lens portion of the light emitting diode was evaluated. The evaluation results are shown in Table 1.

Example 3

ETFE (2) was prepared so as to contain (repeating units derived from TFE)/(repeating units derived from E)/(repeating units of PFBE)=56.4/39.6/4.0 (molar ratio) and have an MFR of 18 g/10 min and a melting point of 222° C.

ETFE (1) in Example 1 and ETFE (2) in Example 2 were mixed in a ratio of 1:1 (mass ratio), and a 15 mm twin screw extruder was employed to melt-knead the mixture at 300° C. to obtain a kneadate. By using the kneadate, a mold release film (3) was obtained so as to have a thickness of 50 μm in the same manner as in Example 1. The mold release film (3) had a tensile modulus of elasticity of 20 MPa at 132° C. and a peak peel resistance of 0.5 N/25 mm.

By using the mold release film (3), a light emitting diode was produced in the same manner as in Example 1. The appearance of the lens portion of the light emitting diode was evaluated. The evaluation results are shown in Table 1.

Example 4

(Production of ETFE)

85.2 kg of 1-hydrotridecafluorohexane, 6.31 kg of AK225cb and 1.22 kg of PFBE were charged into the autoclave subjected to evacuation, having an internal capacity of 94 litters and made of stainless steel, and were heated up to 66° C. while being stirred. A gas mixture of TFE/E=89/11 (molar ratio) was introduced into the heated mixture until the pressure reached 1.5 MPa. 30.2 kg of a 50 mass % solution of tert-butyl peroxypivalate in AK225cb was charged to initiate polymerization. During polymerization, a gas mixture of TFE/E=60/40 (molar ratio) and 3.3 mol % of PFBE relative to the gas mixture were continuously added so as to maintain a pressure at 1.5 MPaG. After 7.19 kg of the gas mixture of TFE/E was charged, the autoclave was cooled, and the residual gas was purged to complete the polymerization. The time required to the polymerization was 305 minutes.

The resulting slurry was transferred into the granulation tank having an internal capacity of 220 liters, 77 liters of water was added to the slurry in the granulation tank, the slurry was heated while being stirred, and the polymerization solvent and the residual gasses were removed to obtain 7.5 kg of granular ETFE (3).

ETFE (3) thus obtained contained (repeating units derived from TFE)/(repeating units derived from E)/(repeating units of PFBE)=56.3/40.7/3.0 (molar ratio) and had an MFR of 17.3 g/10 min and a melting point of 236.9° C.

(Production of Mold Release Film)

By melt-extruding ETFE (3) by the extruder having a lip adjusted to provide ETFE (3) with a thickness of 50 μm, a mold release film (4) was obtained so as to have a thickness of 50 μm. The mold release film (4) had a tensile modulus of elasticity of 40 MPa at 132° C. and a peak peel resistance of 0.3 N/25 mm.

(Production of Light Emitting Diode)

The mold release film (4) was used to produce a light emitting diode in the same manner as in Example 1. The appearance of the lens portion of the light emitting diode was evaluated. The evaluation results are shown in Table 1.

Example 5

An ethylene/propylene/tetrafluoroethylene copolymer (hereinbelow, referred to as PTFE) was prepared so as to contain (repeating units derived from TFE)/(repeating units derived from E)/(repeating units derived from propylene)= 54.8/28.7/16.5 (molar ratio) and have an MFR of 6 g/10 min and a melting point of 172° C.

By melt-extruding PETFE at 250° C. by the extruder having a lip adjusted to provide PETFE with a thickness of 50 μm, a mold release film (5) was obtained so as to have a thickness of 50 μm. The mold release film (5) had a tensile modulus of elasticity of 4 MPa at 132° C. and a peak peel resistance of 0.8 N/25 mm.

The mold release film (5) was used to produce a light emitting diode in the same manner as in Example 1. The appearance of the lens portion of the light emitting diode was evaluated. The evaluation results are shown in Table 1.

Example 6

An ETFE film (Fluon LM-ETFE film manufactured by Asahi Glass Company, Limited and having a thickness of 50 μm) was prepared. A test sheet, which was fabricated from the raw material resin of the LM-ETFE film, had a tensile modulus of elasticity of 28 MPa at 132° C. and a peak peel resistance of 0.3 N/25 mm.

The ETFE film was used to produce a light emitting diode in the same manner as in Example 1. The appearance of the lens portion of the light emitting diode was evaluated. The evaluation results are shown in Table 1.

Example 7

A PP film (unstretched polypropylene film having a FPK grade and a thickness of 25 μm manufactured by Futamura Chemical Co., Ltd.) was prepared. A test sheet, which was fabricated from the PP film, had a tensile modulus of elasticity of 65 MPa at 132° C. and a peak peel resistance of 3.6 N/25 mm.

The PP film was used to produce a light emitting diode in the same manner as in Example 1. The appearance of the lens portion of the light emitting diode was evaluated. The evaluation results are shown in Table 1.

Example 8

Corona discharge was carried out on one of both sides of a mold release film having a thickness of 50 μm obtained in the same manner as in Example 1 (by means of Corona Generator HV-05-2 manufactured by TANTEC and having an output voltage of 60 V and an output frequency of 30 kHz) to obtain a mold release film (8). The mold release film (8) had a tensile modulus of elasticity of 12 MPa at 132° C. and a peak peel resistance of 6.5 N/25 mm.

The mold release film (8) was used to produce a light emitting diode as in the same manner as in Example 1. It should be noted that the mold release film (8) was disposed so as to have the corona-discharge-treated side facing the lower die 52. The appearance of the lens portion of the light emitting diode was evaluated. The evaluation results are shown in Table 1.

TABLE 1

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Material of mold release film | ETFE | ETFE | Blended ETFE | ETFE | EPTFE | LM-ETFE | PP | ETFE |
| Tensile modulus of elasticity at 132° C. (MPa) | 12 | 12 | 20 | 40 | 4 | 28 | 65 | 12 |
| Peak peel resistance (N/25 mm) | 0.6 | 0.6 | 0.5 | 0.3 | 0.8 | 0.3 | 3.6 | 6.5 |
| Thickness (μm) | 50 | 25 | 50 | 50 | 50 | 50 | 25 | 50 |
| Appearance of lens portion | ◎ | ◎ | ○ | X | X | X | No peel | No peel |

Example 4 shows reproduction of Example 1 of Patent Document 1. In Example 4, because the mold release film had a high tensile modulus of elasticity, the mold film was ununiformly stretched to generate a large thickness difference (non-uniformity in thickness) therein after having followed the mold such that the thickness difference was transferred to the lens portion to cause poor appearance (distortion).

In Example 5, because the mold release film had a low tensile modulus of elasticity, the mold film was too soft to be uniformly tensioned during winding such that a wrinkle was readily generated and the wrinkle was transferred to the lens portion to cause poor appearance.

In Example 6, because the ETFE film had a high tensile modulus of elasticity, the ETFE film was ununiformly stretched to generate a large thickness difference (non-uniformity in thickness) therein after having followed the mold such that the thickness difference was transferred to the lens portion to cause poor appearance (distortion).

In Example 7, since the PP film had a high peel resistance, the PP film was not peeled when an attempt was made to open the mold and peel the PP film from the lens portion after curing of the encapsulation resin, with the result that it was impossible to produce a light emitting diode.

In Example 8, because the ETFE film had a large peak peel resistance, the ETFE film was not stripped when an attempt was made to open the mold and peel the film from the lens portion after curing of the encapsulation resin, such that it was impossible to produce a light emitting diode.

INDUSTRIAL APPLICABILITY

The mold release film according to the present invention is useful as a mold release film, which is disposed on the cavity surface of a mold to form a resin-encapsulated portion by encapsulating the semiconductor element of a semiconductor device with an encapsulation resin.

This application is a continuation of PCT Application No. PCT/JP2013/051917, filed on Jan. 29, 2013, which is based upon and claims the benefit of priority from Japanese Patent Application No. 2012-016476 filed on Jan. 30, 2012. The contents of those applications are incorporated herein by reference in their entireties.

REFERENCE NUMERALS

1 Light emitting diode
10 Substrate
12 Light emitting element
14 Lens portion
16 Cured product
20 Upper die
22 Lower die
24 Cavity
26 Cavity surface
30 Mold release film
40 Encapsulation resin
50 Upper die
52 Lower die
54 Cavity
56 Cavity surface
58 Substrate-placing portion
60 Resin-introducing portion
62 Resin-placing portion
64 Plunger

What is claimed is:

1. A mold release film adapted to be disposed on the cavity surface of a mold to form a resin-encapsulated portion by encapsulating a semiconductor element of a semiconductor device with a curable encapsulation resin,
the mold release film having:
a tensile modulus of elasticity of from 10 to 24 MPa at 132° C. as measured in accordance with JIS K 7127, and
a peak peel resistance of at most 0.8 N/25 mm.

2. The mold release film according to claim 1, which is a film made of a fluororesin.

3. The mold release film according to claim 2, wherein the fluororesin is a copolymer including units derived from tetrafluoroethylene, units derived from ethylene and units derived from a third monomer other than them.

4. The mold release film according to claim 3, wherein the third monomer is (perfluorobutyl)ethylene.

5. The mold release film according to claim 4, wherein the copolymer is a copolymer which has a molecular ratio of from 80/20 to 40/60 of repeating units derived from tetrafluoroethylene to repeating units derived from ethylene (tetrafluoroethylene/ethylene) and,
wherein the molecular ratio of repeating units derived from (perfluorobutyl)ethylene to all repeating units (100 mol %) is from 5 to 10 mol %.

6. A process for producing a semiconductor device by encapsulating a semiconductor element with a curable encapsulation resin by means of a mold; comprising disposing a mold release film on a cavity surface of the mold in contact with the encapsulation resin, the mold release film having a tensile modulus of elasticity of from 10 to 24 MPa at 132° C. as measured in accordance with JIS K 7127, and a peak peel resistance of at most 0.8 N/25 mm, and form a resin-encapsulated portion by curing the encapsulation resin in such a state that the encapsulation resin is brought into contact with the mold release film.

7. The process for producing a semiconductor device according to claim 6, wherein the semiconductor device is a light emitting diode, the semiconductor element is a light emitting element, and the resin-encapsulated portion is a lens portion.

8. The process for producing a semiconductor device according to claim 7, wherein the lens portion has an externally exposed portion, the externally exposed portion having an area of at least 56 mm$^2$.

9. The process for producing a semiconductor device according to claim 6, wherein the encapsulation resin is a thermosetting resin, and the encapsulation resin is thermally cured in such a state that the encapsulation resin is brought into contact with the mold release film.

10. The process for producing a semiconductor device according to claim 6, wherein the formation of the resin-encapsulated portion by means of a mold is carried out by a compression molding method.

11. The process for producing a semiconductor device according to claim 6, wherein the formation of the resin-encapsulated portion by means of a mold is carried out by a transfer molding method.

12. A process for producing a semiconductor device, including the following steps ($\alpha$1) to ($\alpha$5):
($\alpha$1) a step of disposing the mold release film as defined in claim 1 to cover a mold cavity,
($\alpha$2) a step of vacuum-suctioning the mold release film to a mold cavity surface side,
($\alpha$3) a step of packing an encapsulation resin in the cavity,
($\alpha$4) a step of obtaining a semiconductor device by disposing a semiconductor element at a certain position in the cavity, and encapsulating the semiconductor element with the encapsulation resin to form a resin-encapsulated portion, and
($\alpha$5) a step of taking out the semiconductor device from the mold.

13. A process for producing a semiconductor device, including the following steps ($\beta$1) to ($\beta$5):
($\beta$1) a step of disposing the mold release film as defined in claim 1 to cover a mold cavity,
($\beta$2) a step of vacuum-suctioning the mold release film to a mold cavity surface side,
($\beta$3) a step of disposing a semiconductor element at a certain position in the cavity,
($\beta$4) a step of obtaining a semiconductor device by packing an encapsulation resin in the cavity, and encapsulating the semiconductor element with the encapsulation resin to form a resin-encapsulated portion, and
($\beta$5) a step of taking out the semiconductor device from the mold.

14. A process for producing a semiconductor device according to claim 12, wherein the semiconductor device is a light emitting diode,
the semiconductor element is a light emitting element,
the resin-encapsulated portion is a lens portion, and
the lens portion has an externally exposed portion, the externally exposed portion having an area of at least 56 mm$^2$.

15. A process for producing a semiconductor device according to claim 13, wherein the semiconductor device is a light emitting diode,
the semiconductor element is a light emitting element,
the resin-encapsulated portion is a lens portion, and
the lens portion has an externally exposed portion, the externally exposed portion having an area of at least 56 mm$^2$.

\* \* \* \* \*